United States Patent
Bock et al.

(10) Patent No.: US 10,251,276 B2
(45) Date of Patent: Apr. 2, 2019

(54) PRINTED CIRCUIT BOARD AND A METHOD FOR PRODUCING A PRINTED CIRCUIT BOARD

(71) Applicant: Conti Temic microelectronic GmbH, Nürnberg (DE)

(72) Inventors: Johannes Bock, Erlangen (DE); Thomas Schmidt, Burglengenfeld (DE); Bernhard Schuch, Neusitz (DE)

(73) Assignee: Conti Temic microelectronic GmbH, Nürnberg (DE)

( * ) Notice: Subject to any disclaimer, the term of this patent is extended or adjusted under 35 U.S.C. 154(b) by 0 days.

(21) Appl. No.: 15/797,542

(22) Filed: Oct. 30, 2017

(65) Prior Publication Data

US 2018/0070450 A1  Mar. 8, 2018

Related U.S. Application Data

(63) Continuation of application No. PCT/EP2016/059542, filed on Apr. 28, 2016.

(30) Foreign Application Priority Data

May 7, 2015 (DE) .................. 10 2015 208 523

(51) Int. Cl.
*H05K 1/18* (2006.01)
*H05K 1/02* (2006.01)
(Continued)

(52) U.S. Cl.
CPC ........... *H05K 1/181* (2013.01); *H05K 1/0278* (2013.01); *H05K 1/141* (2013.01); *H05K 3/0044* (2013.01);
(Continued)

(58) Field of Classification Search
CPC ...... H05K 1/181; H05K 1/0278; H05K 1/028; H05K 1/141
See application file for complete search history.

(56) References Cited

U.S. PATENT DOCUMENTS 4,631,819 A  12/1986 Lasier et al.
5,257,718 A  11/1993 Chiu
(Continued)

FOREIGN PATENT DOCUMENTS

CN  103493607 A  1/2014
DE  102006007813 A1  8/2007
(Continued)

OTHER PUBLICATIONS

International Search Report and Written Opinion dated Apr. 28, 2016 from corresponding International Patent Application No. PCT/EP2016/059542.
(Continued)

*Primary Examiner* — Hoa C Nguyen

(57) ABSTRACT

The disclosure relates to a printed circuit board for an electronic component. The printed circuit board includes: an electrically insulating substrate; a number of electrically conductive conductor tracks; and at least one sensor dome having a sensor head and having a carrier body for accommodating the sensor head. The carrier body is formed integrally with the substrate. The disclosure also relates to a method for producing the printed circuit board.

6 Claims, 5 Drawing Sheets

(51) Int. Cl.
*H05K 1/14* (2006.01)
*H05K 3/36* (2006.01)
*H05K 3/00* (2006.01)
*H05K 3/28* (2006.01)
*H05K 3/30* (2006.01)
*H05K 5/00* (2006.01)

(52) U.S. Cl.
CPC .............. *H05K 3/284* (2013.01); *H05K 3/303* (2013.01); *H05K 3/366* (2013.01); *H05K 5/0082* (2013.01); *H05K 2201/09045* (2013.01); *H05K 2201/10151* (2013.01); *H05K 2201/10166* (2013.01); *H05K 2203/302* (2013.01)

(56) References Cited

U.S. PATENT DOCUMENTS

2008/0233353 A1  9/2008  Sakurai
2011/0075384 A1* 3/2011  Yeates ............... H05K 1/0271
                                                    361/752
2011/0214905 A1* 9/2011  Pahl .................. H05K 1/189
                                                    174/254
2014/0055974 A1  2/2014  Hansen

FOREIGN PATENT DOCUMENTS

| DE | 102013212940 A1 | 12/2014 |
| JP | 2004104037 A | 4/2004 |
| JP | 2004119624 A | 4/2004 |
| JP | 2011523223 A | 8/2011 |
| JP | 2014518003 A | 7/2014 |

OTHER PUBLICATIONS

Japanese Office Action dated Dec. 11,2018 for corresponding Japanese application No. 2017-557959.
Chinese Office Action dated Jan. 16,2019 for corresponding Chinese application No. 2016800147643.

* cited by examiner

PRINTED CIRCUIT BOARD AND A METHOD FOR PRODUCING A PRINTED CIRCUIT BOARD

CROSS-REFERENCE TO RELATED APPLICATIONS

This application claims the benefit of PCT Application PCT/EP2016/059542, filed Apr. 28, 2016, which claims priority to German Application DE 10 2015 208 523.6, filed May 5, 2015. The disclosures of the above applications are incorporated herein by reference.

TECHNICAL FIELD

The disclosure relates to a printed circuit board for an electronic component. The disclosure also relates to a method for producing the printed circuit board.

BACKGROUND

In motor vehicles, electronic components with an electronic control circuit and associated electronic components, such as sensors, are used for various tasks. For example, in the case of the electronic component used as a control unit in a transmission, a number of sensors are used to detect rotational speeds of shafts and positions of actuators.

The sensors are electrically connected to the electronic control circuit by electrical feed lines, in particular, leadframes or flexible foil conductors, which are normally arranged on a printed circuit board. The leadframes have for example electrical signal lines encapsulated with plastic, and, together with the sensor as electronic component and a sensor cover, form a sensor dome.

SUMMARY

The disclosure relates to a printed circuit board that is improved in relation to the prior art and a method for producing the printed circuit board.

One aspect of the disclosure provides a printed circuit board for an electronic component. The printed circuit board includes an electrically insulating substrate, a number of electrically conductive conductor tracks, and at least one sensor dome having a sensor head and having a carrier body for accommodating the sensor head. The carrier body is formed integrally with the substrate.

Since the carrier body is formed from the substrate of the printed circuit board, no additional materials are needed for producing the sensor dome. The printed circuit board can thus be produced much more cost-effectively in relation to the prior art. Furthermore, costs for the electrical connection of the sensor dome are reduced in relation to known printed circuit boards, because the conductor tracks that are embedded in the substrate can be used for the electrical contacting of the sensor dome, and separate leadframes, electrical lines and sealing elements are omitted.

Implementations of the disclosure may include one or more of the following optional features. In some implementations, the substrate is formed from a fiber-reinforced plastic, for example, glass-fiber-reinforced plastic, such that the printed circuit board can be produced inexpensively. Furthermore, fiber-reinforced plastic is particularly advantageous as a material for the carrier body, because this permits very good mechanical stability.

In some examples, the mechanical stability is advantageous if the carrier body with the sensor head and thus the sensor dome projects perpendicularly from a surface side of the substrate. The spatially separate arrangement of the sensor head in relation to the printed circuit board is dependent on a position and orientation of a component whose parameters are to be detected by the sensor head.

In some implementations, the sensor head is connected mechanically and in electrically conductive fashion to at least one conductor track. The number of conductor tracks is arranged on the surface side and within the substrate. For example, for this purpose, the printed circuit board is of multi-layer form and has multiple layers with conductor tracks. Since the carrier body is formed integrally with the substrate, the conductor tracks that are already provided on the substrate may be used for the electrical contacting of the sensor head, such that separate electrical feed lines, e.g., leadframes or flexible foil conductors, are not necessary, and thus costs can be reduced in relation to the prior art.

For protection of the sensor head against external influences, for example transmission oil, the printed circuit board may have a cover that encapsulates the sensor dome. The cover may be laminated on or adhesively bonded to the sensor dome.

Another aspect of the disclosure provides a method for producing the printed circuit board, where the carrier body of the sensor dome is formed integrally with the substrate of the printed circuit board.

The method permits cost-effective production of the printed circuit board with reduced material outlay in relation to the prior art and with reduced method steps, because separate mounting of the sensor dome on the printed circuit board is not necessary.

In some implementations, the method provides that the carrier body is cut out, with a predefined contour, from the substrate by virtue of a layer being introduced into the printed circuit board to which the insulating layers of the printed circuit board do not adhere. At least a part of the carrier body remains integrally connected to the substrate. The cut-out carrier body may subsequently be positioned with the sensor head in the direction of a vertical axis relative to the surface side of the substrate. The connected part of the carrier body forms the base or the foot of the sensor dome, where a separate connection of the sensor dome to the printed circuit board is not necessary. The printed circuit board can thus be produced in a particularly simple manner.

In some implementations, the method includes the following steps: providing an unpopulated circuit board; arranging a foil with an anti-adhesion coating within the substrate; arranging the sensor head within the substrate, where the sensor head is arranged above the foil in relation to the vertical axis; cutting out the carrier body with the predefined contour, which encompasses a section surrounding the sensor head; positioning the sensor dome, where the cut-out carrier body with the sensor head is moved in the direction of the vertical axis relative to the surface side; and encapsulating the sensor dome with a cover.

The arrangement of the foil and of the sensor head within the substrate may be performed for example when the substrate is in a liquid state, where the substrate subsequently hardens. It is alternatively also possible for the printed circuit board to be manufactured from multiple already-hardened layers, where the layers have particular recesses for accommodating the sensor head. The foil may be positioned in a simple manner between the layers. The layers are subsequently joined together.

The foil serves, in the method, for the simple cutting-out of the carrier body from the substrate, such that no cutting process is required perpendicular to the vertical axis. For this purpose, a depth of penetration of a cutting tool for cutting out the carrier body is set in a manner dependent on a situation of the foil in the substrate.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1A:
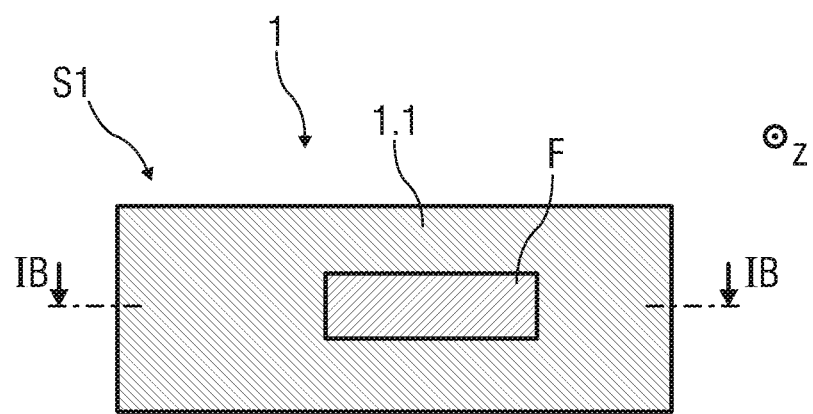
FIG. 1A is a plan view of an exemplary printed circuit board at a first method step.
Figure 1B:
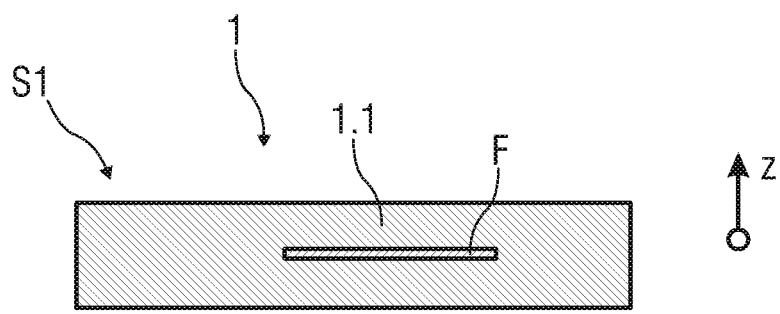
FIG. 1B is a sectional view of the printed circuit board of FIG. 1A along IIB.

FIGS. 1A-5B show various views of a printed circuit board 1 during a production process. FIGS. 1A and 1B show the printed circuit board 1 schematically in a first method step S1, where FIG. 1A shows the printed circuit board 1 in a semi-transparent plan view, and FIG. 1B shows the printed circuit board in a sectional illustration.

Figure 2A:
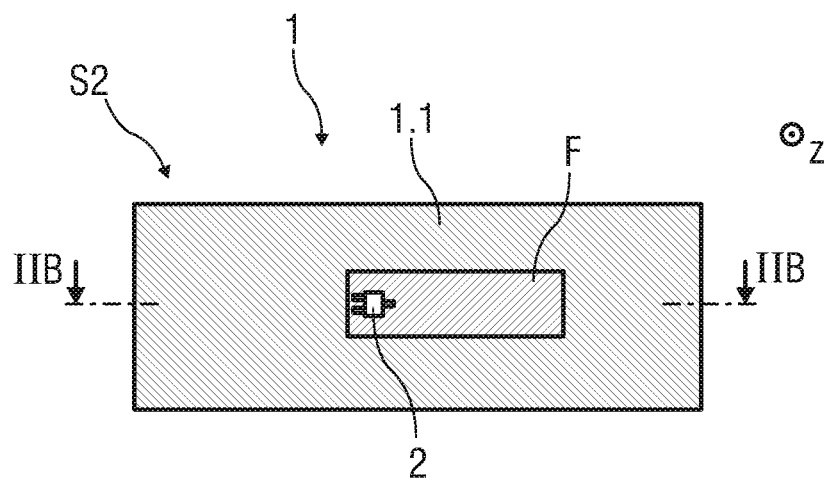
FIG. 2A is a plan view of the exemplary printed circuit board at a second method step.
Figure 2B:
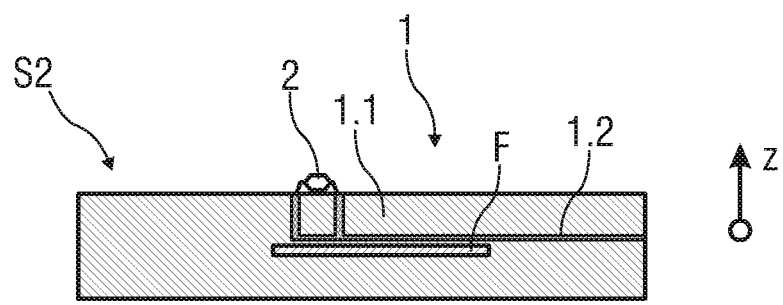
FIG. 2B is a sectional view of the printed circuit board of FIG. 2A along IIB.

The circuit board 1 is formed from an electrically insulating substrate 1.1 and has a number of electrically conductive conductor tracks 1.2, where one conductor track 1.2 is shown by way of example in FIG. 2B.

In some examples, the substrate 1.1 is a multi-layer carrier plate which is manufactured from a fiber-reinforced plastic, for example, epoxy resin. The number of conductor tracks 1.2 is applied to a respective layer in the substrate 1.1. FIG. 2B shows a conductor track 1.2 in the interior of the substrate 1.1. Furthermore, the printed circuit board 1 has at least one connection surface for the purposes of electrical contacting (not illustrated).

In the first method step S1, a foil F with an anti-adhesion coating, for example polytetrafluoroethylene, is introduced into the substrate 1.1 of the printed circuit board 1. The anti-adhesion coating has the effect that the foil F does not form a connection, or at least forms only a negligible connection, to the substrate 1.1 of the printed circuit board 1.

The foil F is formed according to the dimensions of a sensor dome S, which is to be produced, relative to the printed circuit board 1. The arrangement of the foil F in the substrate 1.1 is performed during the manufacture of the printed circuit board 1 from the substrate 1.1, which is for example provided as casting resin in liquid form and hardens. In some examples, it is alternatively also possible for the printed circuit board 1 to be manufactured from multiple already-hardened layers.

FIGS. 2A and 2B show the printed circuit board 1 in a second method step S2, which chronologically follows the first method step S1. Here, FIG. 2A shows the printed circuit board 1 in a semi-transparent plan view, and FIG. 2B shows said printed circuit board in a sectional illustration.

Here, the printed circuit board 1 is populated with electronic components, where a sensor head 2 of the sensor dome S is arranged as an electronic component. The sensor (sensor head 2) is a conventional sensor, for example an SOT23 or SOT89 (SOT=standard outline transistor), and is formed as a housed component. The printed circuit board 1 may be populated with further electronic components that are not shown. The arrangement of the sensor head 2 is likewise performed during the manufacture of the printed circuit board 1 from the substrate 1.1, where the sensor head 2 is for example immersed in the liquid casting resin. It is alternatively also possible for the hardened layers to be equipped with corresponding depressions for accommodating the sensor and further electronic components, where the layers are subsequently joined together.

In some examples, FIG. 2B shows the sensor head 2, which is connected to a conductor track 1.2 in the interior of the substrate 1.1.

In a third method step S3 which chronologically follows the second method step S2, a contour K of a sensor dome S which is to be produced is cut out from the substrate 1.1. In particular, a contour K of a carrier body 2.1, illustrated in more detail in FIGS. 4A to 5B, of the sensor dome S is cut out.

Figure 3A:
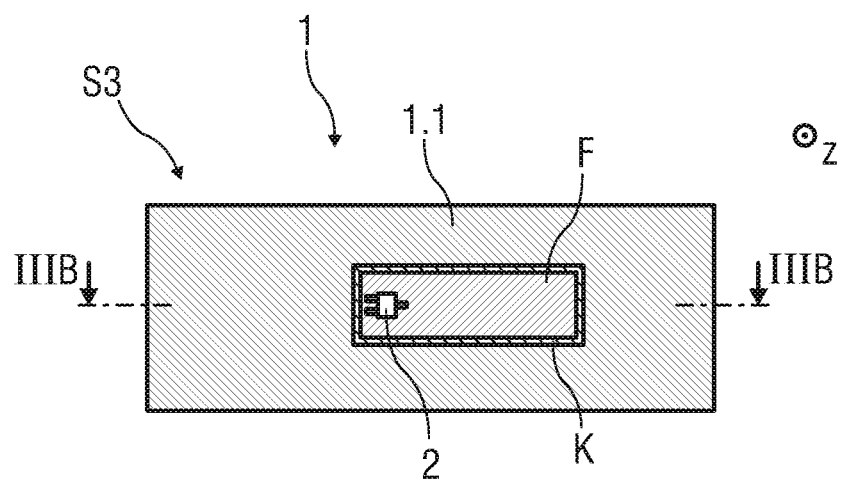
FIG. 3A is a plan view of the exemplary printed circuit board at a third method step.
Figure 3B:
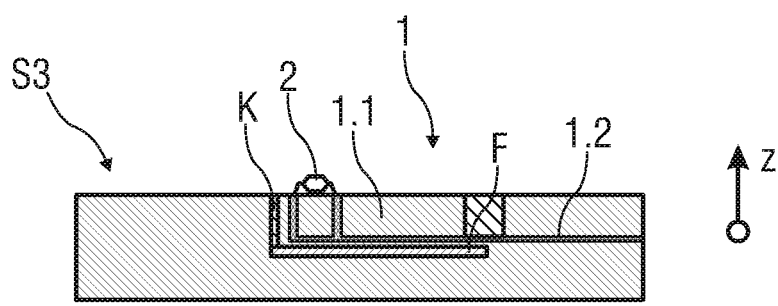
FIG. 3B is a sectional view of the printed circuit board of FIG. 3A along IIIB.

In this regard, FIGS. 3A and 3B show the printed circuit board 1 in the third method step S3, where FIG. 3A shows the printed circuit board 1 in a semi-transparent plan view, and FIG. 3B shows the printed circuit board in a sectional illustration.

The contour K that is to be cut out is determined by the dimensions of the foil F, which are known to a cutting tool, for example a milling machine. The cutting tool subsequently cuts the carrier body 2.1 out of the substrate 1.1 according to the contour K, where an edge of a base or foot of the carrier body 2.1 remains connected to the substrate 1.1. For this purpose, it is for example the case that, at a right-hand end of the contour K as seen in the viewing direction shown in FIG. 3A, a depth of penetration of the cutting tool is reduced.

Subsequently, in a fourth method step S4, the carrier body 2.1 is positioned with the sensor head 2 in the direction of a vertical axis z relative to the printed circuit board 1.

Figure 4A:
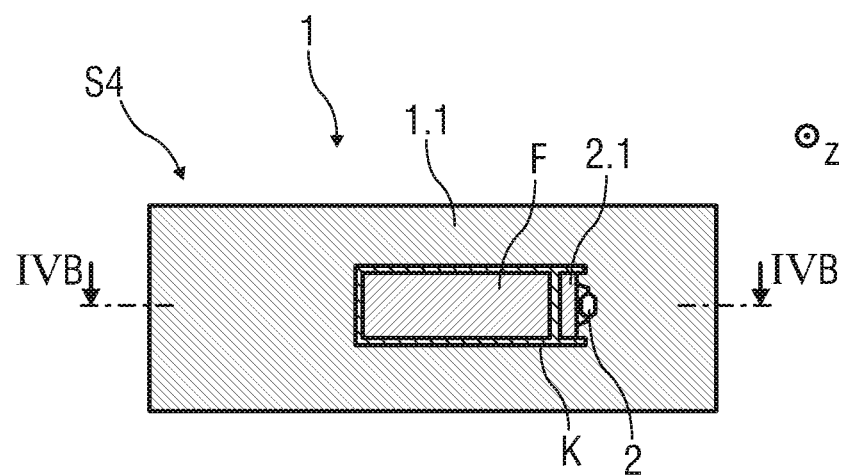
FIG. 4A is a plan view of the exemplary printed circuit board at a fourth method step.
Figure 4B:
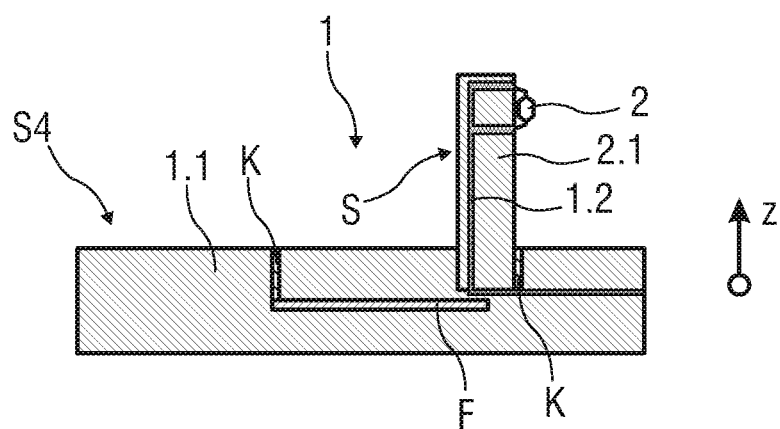
FIG. 4B is a sectional view of the printed circuit board of FIG. 4A along IVB.

FIGS. 4A and 4B show the printed circuit board 1 in the fourth method step S4, where FIG. 4A shows the printed circuit board 1 in a semi-transparent plan view and FIG. 4B shows the printed circuit board in a sectional illustration.

In the fourth method step S4, the carrier body 2.1, the sensor head 2 and a section of the conductor track 1.2, which together form the sensor dome S, are moved in the direction of the vertical axis z until a longitudinal orientation of the carrier body 2.1 is perpendicular to a flat side of the printed circuit board 1.

Figure 5A:
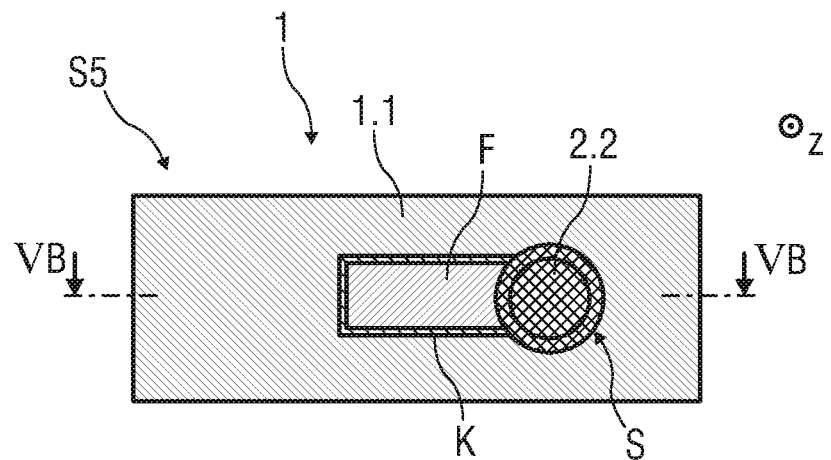
FIG. 5A is a plan view of the exemplary printed circuit board at a fifth method step.
Figure 5B:
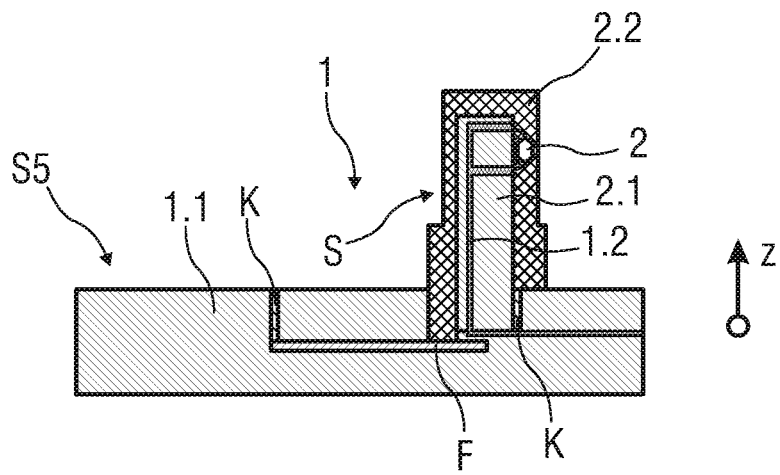
FIG. 5B show various schematic views of an exemplary printed circuit board during the production process.

Finally, the sensor dome S is provided with a cover 2.2, as illustrated in FIGS. 5A and 5B.

Here, FIGS. 5A and 5B show the printed circuit board 1 in a fifth method step S5 which chronologically follows the fourth method step S4, where FIG. 5A shows the printed circuit board 1 in a semi-transparent plan view, and FIG. 5B shows the printed circuit board in a sectional illustration.

In some examples, the cover 2.2 is formed from an electrically insulating material and is applied in media-tight fashion to the sensor dome S, for example by means of lamination or adhesive bonding. The cover 2.2 protects the sensor dome S against external influences, for example chemically aggressive media such as transmission oils. Furthermore, the cover 2.2 mechanically stabilizes the sensor dome S.

The printed circuit board 1 produced in this way is suitable for arrangement in an electronic component in a motor vehicle, for example, a transmission control unit. Here, as previously mentioned, the sensor dome S is provided, for example, for detecting rotational speed detection and/or for detecting positions of gear actuators.

In some implementations, the printed circuit board 1 may also have multiple sensor domes S.

A number of implementations have been described. Nevertheless, it will be understood that various modifications may be made without departing from the spirit and scope of the disclosure. Accordingly, other implementations are within the scope of the following claims.

What is claimed is:

1. A printed circuit board for an electronic component, the printed circuit board comprising:
   an unpopulated circuit board;
   an electrically insulating substrate;
   a foil comprising an anti-adhesion coating, the foil arranged within the electrically insulating substrate;
   a number of electrically conductive conductor tracks; and
   at least one sensor dome having:
      a sensor head arranged within the electrically insulating substrate, wherein the sensor head is arranged above the foil in relation to a vertical axis relative to a surface side of the electrically insulating substrate; and
      a carrier body supporting the sensor head, the carrier body formed integrally with the electrically insulating substrate, the carrier body is cut out with a predefined contour encompassing a section surrounding the sensor head from the electrically insulating substrate, at least a part of the carrier body remains integrally connected to the electrically insulating substrate,
      wherein the cut-out carrier body with the sensor head is positioned in a direction of the vertical axis,
      wherein the sensor dome is positioned such that the cut-out carrier body with the sensor head is moved in the direction of the vertical axis relative to the surface side; and
   a cover encapsulating the sensor dome.

2. The printed circuit board of claim 1, wherein the electrically insulating substrate is formed from a fiber-reinforced plastic.

3. The printed circuit board of claim 1, wherein the carrier body projects perpendicularly from a surface side of the electrically insulating substrate.

4. The printed circuit board of claim 1, wherein the sensor head is connected mechanically and in electrically conductive fashion to at least one conductor track.

5. A method for producing a printed circuit board having an electrically insulating substrate, a number of electrically conductive conductor tracks, and at least one sensor dome having a sensor head and having a carrier body for accommodating the sensor head, wherein the carrier body is formed integrally with the substrate, the method comprising:
   integrally forming the carrier body of the sensor dome with the substrate of the printed circuit board by:
      providing an unpopulated circuit board;
      arranging a foil with an anti-adhesion coating within the electrically insulating substrate;
      arranging the sensor head within the electrically insulating substrate, wherein the sensor head is arranged above the foil in relation to a vertical axis relative to a surface side of the electrically insulating substrate;
      cutting out the carrier body with a predefined contour, which encompasses a section surrounding the sensor head;
      positioning the sensor dome, wherein the cut-out carrier body with the sensor head is moved in a direction of the vertical axis relative to the surface side; and
      encapsulating the sensor dome with a cover,
   wherein the carrier body is cut out, with the predefined contour, from the electrically insulating substrate, wherein at least a part of the carrier body remains integrally connected to the electrically insulating substrate, and
   wherein the cut-out carrier body is positioned with the sensor head in the direction of the vertical axis.

6. The method of claim 5, wherein a penetration depth of a cutting tool for cutting out the carrier body is set in a manner dependent on a situation of the foil in the electrically insulating substrate.

* * * * *